Oct. 29, 1957 F. PAPOUSCHEK 2,811,594

SWITCH

Filed Sept. 20, 1954 2 Sheets-Sheet 1

INVENTOR.
FRANZ PAPOUSCHEK
BY F. A. Rechif
AGENT

INVENTOR.
FRANZ PAPOUSCHEK
BY
[signature]
AGENT

United States Patent Office 2,811,594

Patented Oct. 29, 1957

2,811,594

SWITCH

Franz Papouschek, Lakeside, Quebec, Canada, assignor to Radio Corporation of America, a corporation of Delaware Application September 20, 1954, Serial No. 456,936

4 Claims. (Cl. 200—14)

This invention relates to electrical switches, and more particularly to multiple multithrow switches of the rotary type.

In operating a communications receiver employing a captive oscillator there is often need to switch the oscillator over a wide frequency range, the switching to take place by means of a bandswitching arrangement which switches to any one of thirty frequency bands. The frequency control system for this captive oscillator may for example be of the type illustrated in my copending application, Serial No. 381,315, filed September 21, 1953, now abandoned, including a harmonic generator and selector for selecting any one of the 3rd through 22nd harmonics of a 1-mc. crystal oscillator frequency. The harmonic generator and selector itself may for example be of the type illustrated in my copending application, Serial No. 423,725, filed April 16, 1954, now Patent No. 2,742,572, dated April 17, 1956. Since the harmonic generator and selector is intended and designed to be gang-switched with the same band-switching arrangement operative on the captive oscillator, a thirty-position switch is required for the harmonic selector.

Heretofore, a thirty-position rotary switch would require a single wafer having thirty contacts or positions. Such wafers are necessarily of special design and construction and therefore very expensive. According to prior practice the thirty positions on the single wafer would have to be provided in a maximum of 360° of angular rotation of the switch. Also, if the thirty positions were provided in 360° of rotation, there could be a maximum of only 12° between adjacent positions, leading to mechanical difficulties in manual setting and proper indexing of the switch. In addition, the thirty terminals to be soldered would be so close together that great difficulty would be experienced in wiring the switch properly.

An object of this invention is to provide a novel construction for increasing the number of different switching arrangements available in a rotary multiposition switch.

A more specific object is to provide a thirty-position switch, using only conventional twelve-position rotary switch wafers, thus obtaining an angle of rotation between adjacent switch positions, of 30°.

The objects of this invention are accomplished, briefly, by distributing the thirty switch positions at ten each to three twelve-position switching wafers or switching levels the rotary wipers of which are mounted to be rotated by a common shaft. An indexing or transfer wafer is freely mounted on the shaft and this latter wafer selects, by means of its contacts, one of the three switching wafers. The indexing wafer is actuated once each shaft revolution, by a Geneva movement, to change the connections from one of the switching wafers to another. The selector switch input is to the indexing wafer and the switch output is from one of the thirty output terminals connected to the switching wafers.

The foregoing and other objects of the invention will be better understood from the following description of an exemplification thereof, reference being had to the accompanying drawings, wherein.

Figure 1:
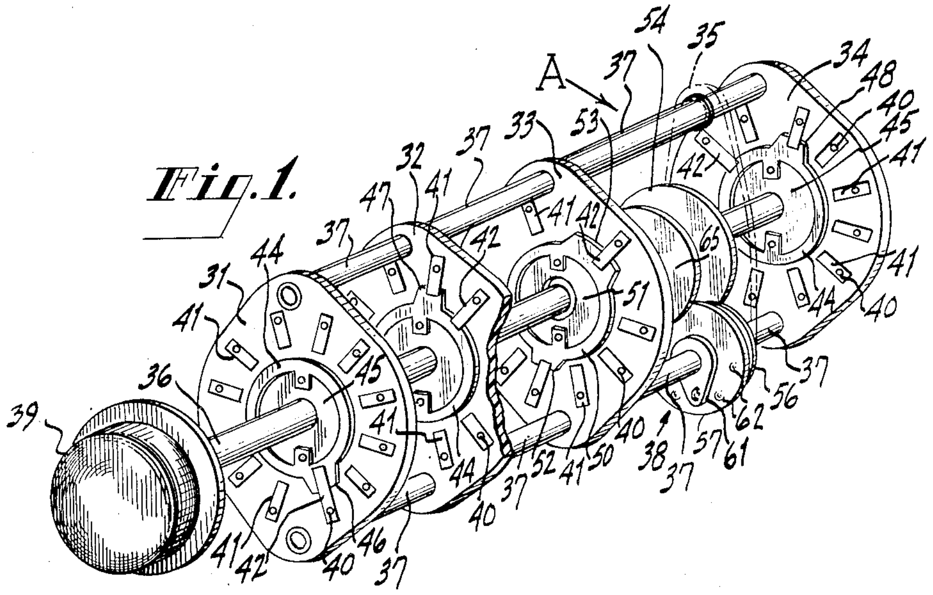
Fig. 1 is a perspective view of a multiposition rotary switch according to this invention.
Figures 2, 3, 4:
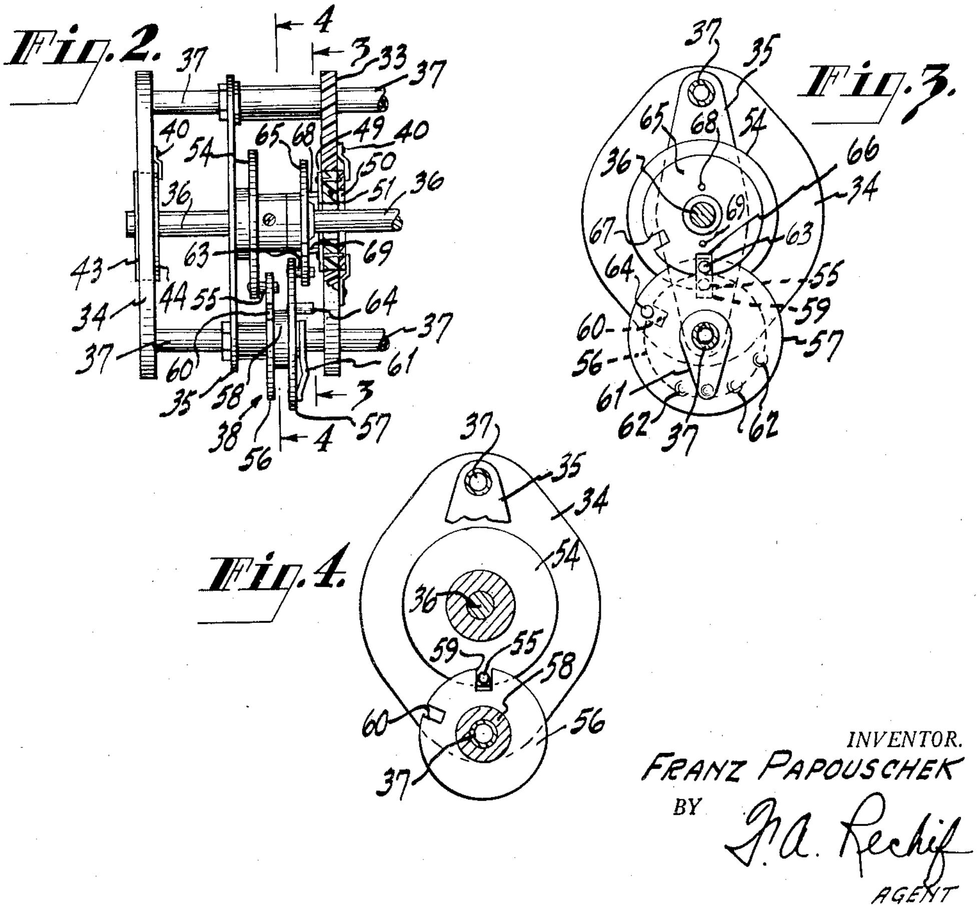
Fig. 2 is a side elevation of the rear portion of the switch, looking generally in the direction A of Fig. 1.
Fig. 3 is a section taken on line 3—3 of Fig. 2, looking in the direction of the arrows.
Fig. 4 is a section taken on line 4—4 of Fig. 2, looking in the direction of the arrows.

Referring to Figs. 1–4, which show the mechanical construction of the switch, said switch comprises terminal bank mounting plates 31, 32, 33 and 34 arranged in different levels and a mounting plate 35 providing a bearing for a rotatable shaft 36, all of which are held in assembled and spaced position by side bolts (not shown) passing through the spacers 37. Also, certain parts of a Geneva movement mechanism, generally denoted by reference numeral 38, are held in properly spaced position by one of the spacers 37, in a manner to be more fully described hereinafter. The mounting plate 35 is secured to both of the side bolts and is provided with a bushing in its center which constitutes the bearing for shaft 36. The shaft 36 has a knob 39 fixed thereto, this knob being formed with a pointed portion (not shown) which serves as an indicating means for the rotation thereof. The side bolts may extend forwardly of the front mounting plate 31 and may be provided with suitable spacers, nuts and washers, whereby the switch assembly may be mounted on a panel for support.

Each of the terminal bank mounting plates or levels 31, 32, 33 and 34 has attached thereto by metal eyelets 40 a plurality of metallic terminals 41 or 42. Thus a multilevel switch is provided, having a plurality of terminals in each of a plurality of levels. The mounting plates may be porcelain or some other suitable insulating material, and are preferably of a type available commercially, having a total of twelve terminals on each mounting plate, adjacent terminals being spaced angularly about 30°. For purposes of economy of manufacture and ease of assembly of the complete switch, the twelve-terminal type mounting plates are preferred, even though all twelve terminals on each plate might not necessarily be utilized. The outer extension (not shown) of each of terminals 41, 42 may be soldered to any desired one of a plurality of electrical conductors (as will be described further hereinafter with reference to Fig. 5) and the inner end is a double-armed wiper (shown in Figs. 1 and 2 as a single-armed wiper for purposes of simplification) adapted to engage the metallic wiper disc of an associated rotor unit.

Each of the rotor units associated with the respective terminal banks 31, 32 and 34 consists of a thin circular metal disc 43 and a circular metal disc 44 spaced apart by a circular insulator 45 of the same thickness as plates 31, 32 and 34, all fastened together by rivets so that the disc 43 and disc 44 engage opposite sides of the inwardly projecting teeth of the respective terminal plates 31, 32 and 34 to form floating rotor units. Each of the three metal discs 44 has an extending lug or wiper 46, 47 or 48 respectively, wiper 46 being associated with plate 31, wiper 47 with plate 32, and wiper 48 with plate 34. The lugs or wipers 46—48 are adapted to engage the associated bank terminals 41 one at a time in succession when the rotor element is rotated. The terminals 42 are feed terminals which extend inwardly to make continuous contact with the associated wiper disc 44; whereas the inwardly projecting wiper arms of terminals 41 are shorter so as to engage the associated wiper disc 44 only when the associated wiper lug 46, 47 or 48 is in corresponding rotary position.

There is a more or less rectangular hole through the middle of each of the insulators 45 for engagement by the shaft 36. Although the shaft 36 is illustrated as being round, this is done only for ease of illustration; actually, this shaft in cross section is like a flattened ellipse which fits tightly into the rectangular holes in each of the insulators 45. In this way, the insulators 45 are all fastened tightly to shaft 36, so that the discs 44 are all rotated directly by shaft 36.

The rotor unit associated with the terminal bank 33 (which may be thought of as the indexing wafer, whereas the terminal banks 31, 32 and 34 may be thought of as the switching wafers) consists of a thin circular insulating disc 49 and a circular metal disc 50 spaced apart by a circular insulator 51 of the same thickness as plate 33, all fastened together by rivets so that the disc 49 and disc 50 engage opposite sides of the inwardly projecting teeth of the terminal plate 33 to form a floating rotor unit. The metal disc 50 has a first extending lug or wiper 52 and a second extending lug 53 of somewhat greater angular length. The lugs or wipers 52 and 53 are adapted to engage certain associated bank terminals 41 in succession when the rotor element is rotated, in a manner to be described more fully hereinafter. Again, the terminal 42 is a feed terminal which extends inwardly to make continuous contact with the associated wiper disc 50; whereas the inwardly projecting wiper arms of terminals 41 are again shorter so as to engage the associated wiper disc 50 only when the wiper lugs 52 or 53 are in corresponding rotary position.

There is an enlarged circular opening through the middle of the insulator 51, through which opening the shaft 36 passes freely. Thus, the elements 49, 50 and 51, although they are all fastened together, are free to move independently of shaft 36 and are not driven or rotated directly by said shaft. The elements 49—51 are driven intermittently through the Geneva movement 38, now to be described.

A metallic disc 54 is securely fastened to shaft 36, to rotate therewith. Disc 54 is provided with an outwardly (frontwardly) projecting pin 55 fastened to disc 54 near the outer periphery thereof. A member machined or otherwise formed from a single piece of metal, and consisting of two longitudinally-spaced discs 56 and 57 and also a bushing 58, is journaled for free rotation, by means of said bushing, on the lower set of spacers 37 which hold the switch in assembled position. Thus, the member 56—58 is free to rotate as a unit with respect to the spacers 37. Disc 56 is provided with two angularly-spaced radially-extending slots 59 and 60, these slots being cut into disc 56 from the outer periphery thereof inwardly for a certain distance. Disc 56 is of such dimensions and is so positioned with respect to pin 55 that pin 55 engages and rides in first slot 59 and then slot 60 during portions of two successive counter-clockwise rotations of disc 54 by shaft 36. In other words, starting from a zero position of disc 54 and assuming counter-clockwise rotation of this disc, at the end of approximately one complete revolution of disc 54 pin 55 will engage and ride in slot 59 to drive or cause rotation of member 56—58 through a small angular distance until pin 55 travels out of slot 59. Then, at the end of approximately a second complete revolution of disc 54, pin 55 will engage and ride in slot 60 to drive or cause rotation of member 56—58 through an additional small angular distance until pin 55 travels out of slot 60. In this way, member 56—58 is driven intermittently from disc 54 or shaft 36 by the rotation of knob 39.

In Figs. 1–5 the rotors and various other elements of the switch of this invention are illustrated in the tenth switch position, of the thirty positions provided by the switch. As previously stated, disc 57 is integral with disc 56 and thus rotates therewith. In order to maintain proper indexing of member 56—58 with respect to disc 54, a spring detent member 61 is provided. Detent 61 is rigidly fastened to the lower set of spacers 37 in front of disc 57 and is provided with a protuberance in its rear surface which is adapted to selectively engage any one of three dimples 62 provided in the front surface of disc 57. Thus, in switch positions 1 through 9, detent 61 engages the left-hand dimple 62, in switch positions 11 through 21 detent 61 engages the center dimple 62, while in switch positions 23 through 30 detent 61 engages the right-hand dimple 62.

Disc 57 is provided with two outwardly (frontwardly) projecting pins 63 and 64 which are angularly spaced from each other and are fastened to disc 57 near the outer periphery thereof. A metallic disc 65 is journaled for free rotation on shaft 36, this disc being thus free to rotate independently of said shaft. Disc 65 is provided with two angularly-spaced radially-extending slots 66 and 67, these slots being cut into disc 65 from the outer periphery thereof inwardly for a certain distance. Disc 65 is of such dimensions and is so positioned with respect to pins 63 and 64 that pin 63 engages and rides in slot 66 during the first intermittently-produced small angular rotation of disc 57, while pin 64 engages and rides in slot 67 during the second intermittently-produced small angular rotation of disc 57. Thus, the disc, pin and slot arrangement 63—67 serves simply as a means for transferring the intermittent rotation of disc 57 to a similar intermittent rotation of disc 65.

The disc 65 is positioned directly in back of insulating disc 49, and two diametrically-opposite pins 68 and 69 are each fastened at their opposite ends to discs 65 and 49, to drive the rotor unit 49—51 directly from disc 65. Thus, it should now be apparent that the rotor unit 49—51 associated with the indexing wafer terminal bank 33 is driven intermittently from shaft 36, through the Geneva movement 38. The rotor unit 49—51 is rotated through a small angle (much smaller than 360°) at or near the end of each complete revolution of shaft 36. The switch described is constructed in such a manner that the shaft 36 can be rotated through approximately three complete revolutions from a zero position, further rotation beyond the zero position and beyond the three revolutions being prevented by the pin 55 (which, it will be remembered, is securely fastened to shaft 36) coming in contact with the unslotted outer periphery of disc 56 at a point clockwise from slot 59 and at a point counter-clockwise from slot 60, respectively.

During any intermittent operation of the Geneva movement 38, when the shaft 36 is rotating counter-clockwise disc 54 is also, since it is keyed to the shaft; disc 56 (and also disc 57 integral therewith) are driven clockwise, driving disc 65 and rotor 50 counterclockwise. Conversely, during an intermittent operation of movement 38 in the reverse direction, when the shaft 36 is rotating clockwise disc 54 is also; discs 56 and 57 are then driven counterclockwise, driving disc 65 and rotor 50 clockwise. Thus, during any operation of the Geneva movement, the rotors 44 and 50 all move in the same direction or sense.

This completes the description of the mechanical construction of the switch of this invention. A description will now be given of a typical circuit in which the switch may be utilized. It will be assumed, for convenience, that the "zero" position of the switch is at the extreme limit of rotation of shaft 36 in the clockwise direction. Also, as previously stated, in Figs. 1–5 the switch is illustrated in the tenth position.

The Geneva movement 38 is constructed and arranged to rotate the disc 50 of indexing wafer 33 two steps after the first revolution of shaft 36 in the counterclockwise direction, and two more steps after the second revolution of shaft 36 in the counterclockwise direction, a "step"

being defined as the distance between any two adjacent terminals on any of the terminal banks, that is, $1/12$ of a complete revolution, a "step" thus being 30° of angular rotation.

Figure 5:
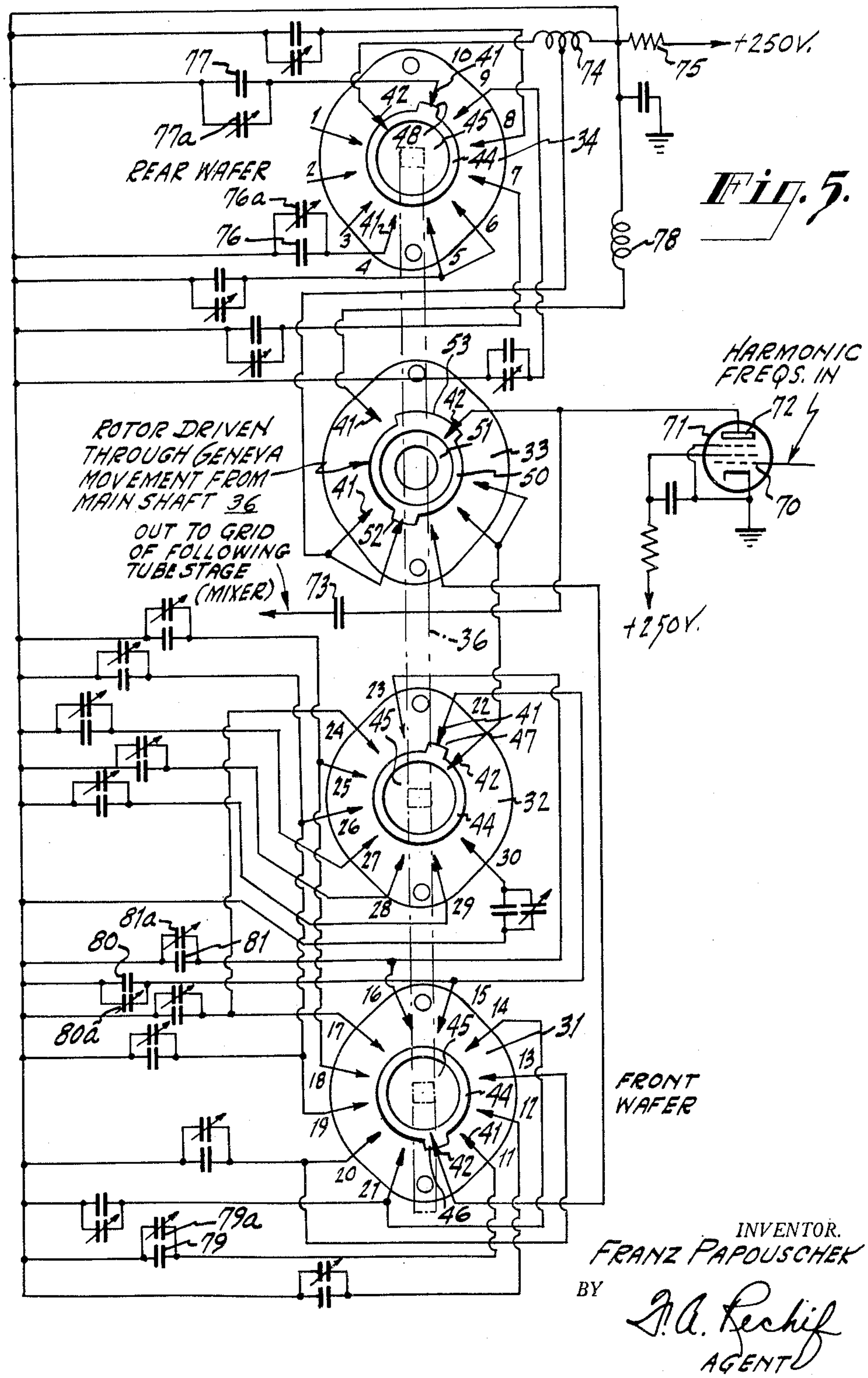
Fig. 5 is a schematic diagram illustrating the switch of this invention used as a harmonic frequency selector.

Referring now to Fig. 5, in which parts the same as those of Figs. 1–4 are denoted by the same reference numerals, the switch of this invention is illustrated in use in a harmonic frequency selector circuit quite similar to that illustrated in my aforementioned copending application, Serial No. 423,725. In the description to follow, it will be pointed out how the switch of this invention operates to provide thirty switch positions from conventional twelve-position switch wafers. Harmonic frequencies, generated for example by the harmonic frequency generator disclosed and claimed in said application Serial No. 423,725 are fed to the control grid 70 of a pentode vacuum tube 71 connected as an amplifier. The harmonic selection is effected in the anode circuit of tube 71, as will later be described, and the selected harmonic is fed from the anode 72 of tube 71 through a coupling capacitor 73 to the grid of a following vacuum tube stage (e. g., a mixer stage) for utilization.

The longer (feed) terminal 42 of terminal bank 33 is connected to anode 72 of tube 71. On terminal bank 33 (the indexing wafer) a lower set of five terminals are adapted to be selectively engaged by wiper lug 52. The two leftmost of these five terminals are connected together and to the midpoint of an inductance 74 which serves as the sole L of the LC resonant circuits for switch positions 1 through 10. One end of this inductance 74 is connected through a resistor 75 to the positive terminal +250 v. of the anode potential source. The common junction of elements 74 and 75 is connected to the common terminals of a plurality of fixed capacitors (each fixed capacitor being shunted by a trimmer capacitor) the other terminals of which are connected each to a respective one of the shorter terminals 41 on the switching wafers 31, 32 and 34; the other end of inductance 74 is connected to the longer (feed) terminal 42 on terminal bank 34.

The numerals 1 through 30 in Fig. 5 denote the corresponding switch positions 1 through 30. In positions 1 through 9 of the switch (before the Geneva movement 38 has come into operation to rotate disc 50 to the position illustrated) wiper 52 is in contact with the leftmost lower terminal 41 of wafer 33. Then, taking for example switch position 4 (terminals 1—3 do not have any capacitors connected to them), the circuit connected to anode 72 is as follows: feed terminal 42 of wafer 33, disc 50, wiper 52, leftmost lower terminal 41 of wafer 33, midtap of inductance 74, resistor 75 to +250 v. source; also, inductance 74, feed terminal 42 of wafer 34, disc 44, wiper 48, terminal 4 (short terminal 41 of wafer 34), capacitors 76 and 76*a* in parallel, and resistor 75 to +250 v. source. Thus, the particular harmonic as determined by the LC constants of elements 74 and 76 is selected in the anode circuit of tube 71. For switch position 10 (illustrated), the Geneva movement 38 has come into operation to rotate disc 50 to the position illustrated, and the circuit connected to anode 72 is as follows: feed terminal 42 of wafer 33, disc 50, wiper 52, second-from-left lower terminal 41 of wafer 33, midtap of inductance 74, resistor 75 to +250 v. source; also, inductance 74, feed terminal 42 of wafer 34, disc 44, wiper 48, terminal 10, capacitors 77 and 77*a* in parallel, and resistor 75 to +250 v. source.

For switch positions 11 through 21 Geneva movement 38 has completed its first operation and wiper 52 is in contact with the center one of the lower bank of five terminals of wafer 33 and wiper 53 is in contact with the upper terminal 41 of wafer 33. The upper terminal 41 of bank 33 is connected through another inductance 78 (which is used in switch positions 11 through 30) to the common junction of inductance 74 and resistor 75. Indexing wafer 33 has now performed its indexing function and the connections are transferred to the front wafer 31 for switch positions 11 through 21. Taking for example switch position 11, the circuit connected to anode 72 is as follows: feed terminal 42 of wafer 33, disc 50, wiper 52, center lower terminal 41 of wafer 33, feed terminal 42 of wafer 31, disc 44, wiper 46, terminal 11 (short terminal 41 of wafer 31), capacitors 79 and 79*a* in parallel, and resistor 75 to +250 v. source; also, disc 50, wiper 53, upper terminal 41 of wafer 33, inductance 78, resistor 75 to +250 v. source.

For switch position 22, the Geneva movement 38 has again come into operation to rotate disc 50 so that wiper 52 is in contact with the second lower terminal from the right of wafer 33 and long wiper 53 is still in contact with the upper terminal 41 of wafer 33. Indexing wafer 33 has again performed its indexing function and the connections are now transferred to the interior wafer 32. For switch position 22, the circuit connected to anode 72 is as follows: feed terminal 42 of wafer 33, disc 50, wiper 52, second-from-right lower terminal 41 of wafer 33, feed terminal 42 of wafer 32, disc 44, wiper 47, terminal 22 (short terminal 41 of wafer 32), capacitors 80 and 80*a* in parallel, and resistor 75 to +250 v. source; also, disc 50, wiper 53, upper terminal 41 of wafer 33, inductance 78, resistor 75 to +250 v. source.

For switch positions 23 through 30, Geneva movement 38 has completed its second operation and wiper 52 is in contact with the rightmost lower terminal 41 of wafer 33 and long wiper 53 is still in contact with the upper terminal 41 of wafer 33. The connections remain transferred (by means of indexing wafer 33) to the interior wafer 32. Taking for example switch position 23, the circuit connected to anode 72 is as follows: feed terminal 42 of wafer 33, disc 50, wiper 52, rightmost lower terminal 41 of wafer 33, feed terminal 42 of wafer 32, disc 44, wiper 47, terminal 23 (of wafer 32), capacitors 81 and 81*a* in parallel, and resistor 75 to +250 v. source; also, disc 50, wiper 53, upper terminal 41 of wafer 33, inductance 78, resistor 75 to +250 v. source.

It may be seen that, for each of switch positions 11 through 30, circuit elements in addition to those previously listed are connected to anode 72, these additional elements being the entire inductance 74 in series with whatever capacitor happens to be selected by wiper 48 of wafer 34 in the particular switch position under consideration. This is true because the common junction of inductance 78 and resistor 77 (and also of inductance 74) is connected via wiper 53, etc. to anode 72, for each of switch positions 11 through 30, as previously described.

For each of the thirty positions of the switch, a predetermined harmonic frequency is selected, depending upon the value of the particular capacitor that is connected (by means of the multiposition rotary switch contacts) into the LC circuit coupled to anode 72. By means of the Geneva-movement-operated indexing wafer 33 described, a thirty-position switch is provided, using only three conventional twelve-position switching wafers 31, 32 and 34.

What is claimed is:

1. A multilevel switch comprising a plurality of terminals in each of at least three levels, rotary wipers one for each of said levels for engaging the terminals of the associated level one terminal at a time in succession, means comprising a shaft for manually rotating all of said wipers at the same rate through a plurality of complete revolutions to selectively position each of said wipers in engagement with any desired terminal of its associated plurality of terminals; a further plurality of terminals the number of which is at least equal to the number of said levels, a rotary wiper for selectively engaging said last-named terminals, connections between said last-named terminals and respective terminals in each of said plurality of levels, and means coupled to said shaft for rotating the last-mentioned rotary wiper through a predetermined angle less than 360° during a portion only of each complete revolution of said shaft, the arrangement being such that each individual level is rendered electrically operative only during a separate corresponding substantially complete revolution of said shaft.

2. A multilevel switch comprising a plurality of terminals in each of a plurality of levels, rotary wipers one for each of said levels for engaging the terminals of the associated level one terminal at a time in succession, means comprising a shaft for manually rotating all of said wipers at the same rate through a plurality of complete revolutions to selectively position each of said wipers in engagement with any desired terminal of its associated plurality of terminals; a further plurality of terminals in still another level, a rotary wiper for said other level for selectively engaging said last-named terminals, said last-mentioned wiper being free to rotate with respect to said shaft, connections between said last-named terminals and respective terminals in each of said plurality of levels, and a Geneva movement coupled between said shaft and said last-mentioned rotary wiper, the arrangement being such that each individual level in each of said plurality of levels is rendered electrically operative only during a separate corresponding substantially complete revolution of said shaft.

3. A multilevel switch comprising a plurality of terminals in each of a plurality of levels, rotary wipers one for each of said levels for engaging the terminals of the associated level one terminal at a time in succession, means comprising a shaft for manually rotating all of said wipers at the same rate through a plurality of complete revolutions to selectively position each of said wipers in engagement with any desired terminal of its associated plurality of terminals; means for selectively rendering operative the terminals in any one of said levels, and means coupled to said shaft for intermittently actuating said selective means to selectively render electrically operative each individual level only during a separate corresponding substantially complete revolution of said shaft.

4. A multilevel switch comprising a plurality of terminals in each of a plurality of levels, rotary wipers one for each of said levels for engaging the terminals of the associated level one terminal at a time in succession, means comprising a shaft for manually rotating all of said wipers at the same rate through a plurality of complete revolutions to selectively position each of said wipers in engagement with any desired terminal of its associated plurality of terminals; a rotary switching device for selectively rendering operative the terminals in any one of said levels, and a Geneva movement coupled between said shaft and the said rotary switching device for intermittently actuating said rotary switching device automatically, independence upon the rotation of said shaft, the arrangement being such that each individual level is rendered electrically operative only during a separate corresponding substantially complete revolution of said shaft.

References Cited in the file of this patent

UNITED STATES PATENTS

| | | |
|---|---|---|
| 1,176,178 | Straub | Mar. 21, 1916 |
| 2,466,238 | Hoof | Apr. 5, 1949 |
| 2,480,589 | McKenney | Aug. 30, 1949 |
| 2,484,576 | Minneci | Oct. 11, 1949 |
| 2,576,836 | Hilsinger | Nov. 27, 1951 |
| 2,700,076 | Goode | Jan. 18, 1955 |